United States Patent
Weiβ et al.

(10) Patent No.: US 7,519,894 B2
(45) Date of Patent: Apr. 14, 2009

(54) MEMORY DEVICE WITH ERROR CORRECTION CODE MODULE

(75) Inventors: Christian Weiβ, München (DE); Sven Kalms, München (DE); Hermann Ruckerbauer, Moos (DE)

(73) Assignee: Infineon Technologies AG, Neubiberg (DE)

( * ) Notice: Subject to any disclaimer, the term of this patent is extended or adjusted under 35 U.S.C. 154(b) by 457 days.

(21) Appl. No.: 11/151,650

(22) Filed: Jun. 14, 2005

(65) Prior Publication Data

US 2007/0011574 A1  Jan. 11, 2007

(51) Int. Cl.
*G11C 29/00* (2006.01)
(52) U.S. Cl. .................. 714/763; 714/718; 714/723; 360/53; 365/200; 365/201
(58) Field of Classification Search .......... 714/763, 714/723, 718; 360/53; 365/200, 201
See application file for complete search history.

(56) References Cited

U.S. PATENT DOCUMENTS

| | | | |
|---|---|---|---|
| 7,028,213 B2* | 4/2006 | Majni et al. ............. | 714/5 |
| 7,234,099 B2* | 6/2007 | Gower et al. ............. | 714/767 |
| 7,272,774 B2* | 9/2007 | Co et al. ................. | 714/764 |
| 7,320,086 B2* | 1/2008 | Majni et al. ............. | 714/5 |
| 2004/0199715 A1* | 10/2004 | Ellis et al. .............. | 711/105 |

* cited by examiner

*Primary Examiner*—Esaw T Abraham
(74) *Attorney, Agent, or Firm*—Edell, Shapiro & Finnan, LLC

(57) ABSTRACT

A memory device includes at least two DRAM memory modules, at least one external ECC module, and a memory controller. The external ECC module provides the memory modules with ECC functionality. Each memory module is connected to the memory controller via a respective memory channel. The external ECC modules are connected to the memory controller via a common ECC channel. Each external ECC module is assigned to a group of the memory modules. The memory modules of one group with respective ECC modules are synchronously operated by the memory controller.

22 Claims, 6 Drawing Sheets

MEMORY DEVICE WITH ERROR CORRECTION CODE MODULE

FIELD OF THE INVENTION

The present invention relates to a memory device.

BACKGROUND

DRAM (Dynamic Random Access Memory) memory modules are frequently used as components of computer systems, like personal computers or servers. In order to improve the reliability of operations of the DRAM memory module, ECC (Error Correction Code) functionality is integrated into the memory modules. Usually, the integration of ECC functionality is realized by adding extra DRAM chips to the DRAM memory module or by integrating the ECC functionality directly into the DRAM memory chips of the DRAM memory modules.

The drawback of DRAM memory modules comprising ECC functionality is that the layout of the DRAM memory modules is more complex than the layout of the "ordinary" memory modules. Usually, the plug contact of DRAM memory modules comprising ECC functionality shows more pins than the plug contact of momeory modules without ECC functionality.

A memory device with ECC functionality that has a more transparent and simple architecture like common memory devices with ECC functionality is desirable.

SUMMARY

A memory device according to the present invention includes at least two DRAM memory modules, at least one external ECC module that provides the memory modules with ECC functionality, and a memory controller. Memory modules are connected to the memory controller via respective memory channels. External ECC modules are connected to the memory controller via a common ECC channel. Each external ECC module is assigned to a group of the memory modules. Memory modules of one group with the respective ECC module are synchronously operated by the memory controller.

First memory modules of different memory module groups are connected to the memory controller by a common memory channel. The same is applicable to the second, third, etc. memory modules of different memory module groups. In this case, in order to operate the memory modules of one memory module group synchronously, several memory channels are used by the memory controller at the same time in order to read/write data to/from the memory modules.

The memory device according to the present invention does not have complex DRAM memory modules with ECC functionality. Instead, standard DRAM memory modules are used. ECC functionality is concentrated within external ECC modules. As a consequence, it is not necessary to provide the plug contact of the memory modules with additional pins (related to ECC functionality). According to the present invention, ECC resources are shared by different DRAM memory modules. Thus, ECC resources are saved.

The memory density of memory modules of a memory module group is substantially the same as the memory density of the external ECC module assigned to the memory module group. Alternatively, the memory density of the external ECC module is half of the memory density of the corresponding memory modules. More generally, the relation memory density (memory modules) to memory density (external ECC module) depends on the amount of memory modules assigned to the corresponding ECC module, on the type of memory chips which are used by the memory modules, the external ECC module, and the relation "used ECC functionality/existing ECC functionality."

In a further embodiment of the present invention, the memory chips of the memory modules of a memory module group are substantially the same as the memory chips of the external ECC module assigned to the memory module group.

In an exemplary embodiment of the present invention, the memory chips of memory modules of a memory module group and the external ECC module assigned to the memory module group show a "by 8" memory architecture.

In another embodiment of the present invention, each memory module includes four ranks of memory chips. However, more or fewer ranks of memory chips can be used.

According to a further exemplary embodiment of the present invention, the first memory rank of each memory module is connected to a memory controller by a point-to-point CA bus connection.

In yet another embodiment of the present invention, at least one group of memory modules includes two memory modules. In a further embodiment of the present invention, at least one group of memory modules includes four memory modules.

In case a group of memory modules includes four memory modules, for example, the selected arrangement of plug contacts of the memory modules is substantially the same as the arrangement of plug contacts of the external ECC module. Further, substantially the same modules for both the memory modules and the external ECC modules can be used.

BRIEF DESCRIPTION OF THE DRAWINGS

In the following, the present invention will be explained by way of example while making reference to the accompanying drawings, wherein.

In the figures, identical elements/parts or elements/parts which correspond with each other are designated with the same reference numerals.

DETAILED DESCRIPTION

Figure 1:
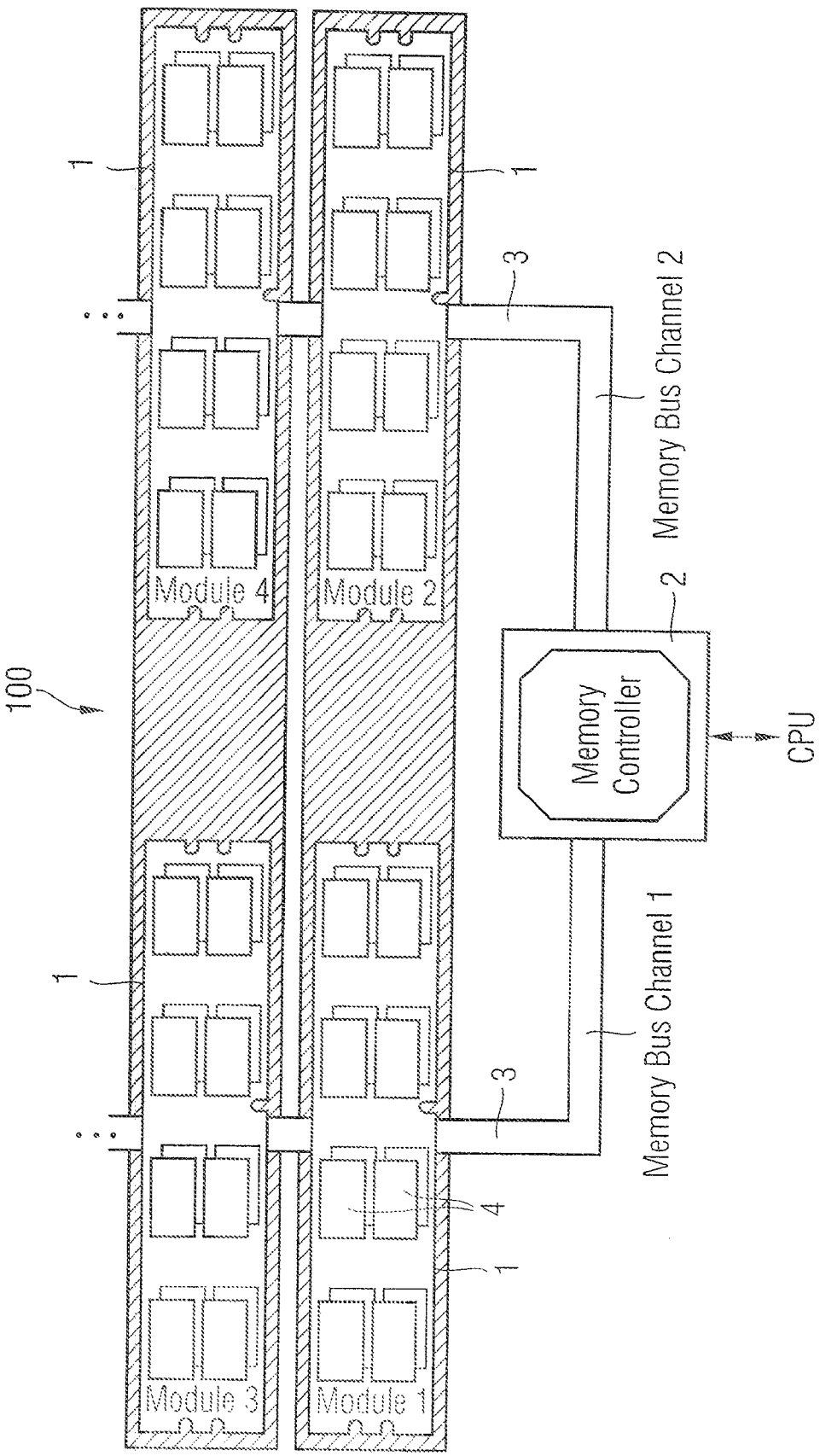
FIG. 1 shows a memory device according to the prior art.

FIG. 1 shows a memory device 100 according to the prior art. The memory device 100 has four DRAM memory modules 1 and a memory controller 2. Each memory module 1 is connected to the memory controller 2 by a respective memory channel 3. In this embodiment, at least two memory modules 1 are connected to each memory channel 3. Each memory module 1 has two ranks of DRAM memory chips 4, i. e., eight memory chips. The memory controller 2 is connected to a central processing unit (CPU) (not shown) and serves as interface between the memory modules 1 and the CPU.

The memory device 100 does not show any ECC functionality. The problem underlying the present invention is to find an easy and transparent way to provide the memory device 100 or similar memory devices with ECC functionality.

Figure 2:
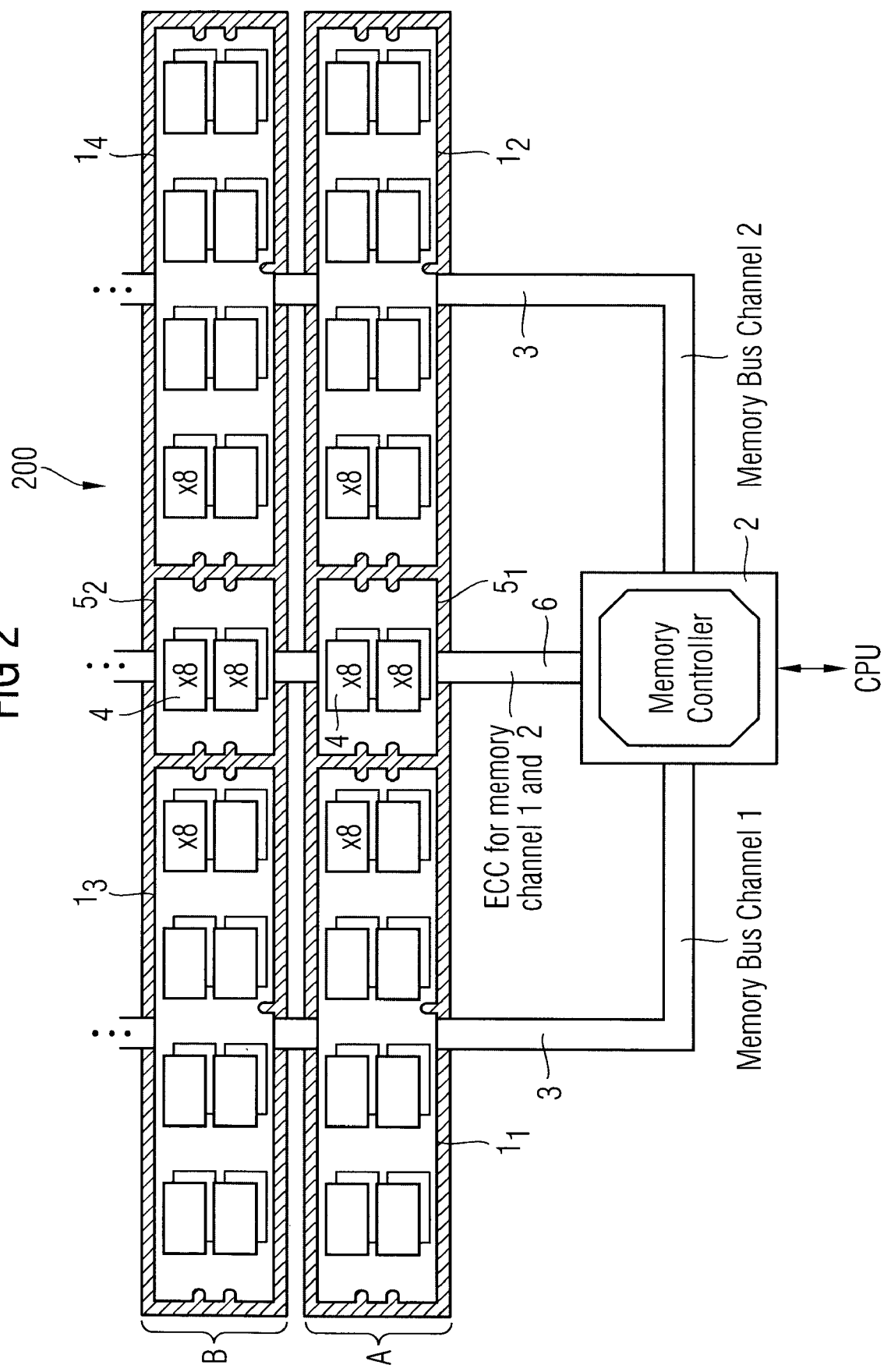
FIG. 2 shows a first embodiment of the memory device according to the present invention.

Referring to FIG. 2, an exemplary embodiment of the memory device 200 according to the present invention includes four DRAM memory modules 1 and two external ECC modules 5 that provide the memory modules 1 with ECC functionality. Each memory module 1 is connected via a memory channel 3 to a memory controller 2. The ECC modules 5 are connected via a common ECC channel 6 to the memory controller 2. The ECC modules 5 are external modules, i. e., the ECC modules 5 are not part of the memory modules 1. Rather, the ECC modules 5 have their own electrical plug contacts. Each external ECC module 5 is assigned to a group of memory modules 1. In this example, a first memory module group A includes a first memory module $1_1$ and a second memory module $1_2$. A second memory module group B includes a third memory module $1_3$ and a fourth memory module $1_4$. A first external ECC module $5_1$ is assigned to the first memory module group A, and a second ECC module $5_2$ is assigned to the second memory module group B. The resources of the first ECC module $5_1$ are both used by the first memory module $1_1$ and the second memory module $1_2$. The resources of the second ECC module $5_2$ are used by the third memory module $1_3$ and the fourth memory module $1_4$.

In this example, the memory chips 4 mounted on the memory modules 1 and the memory chips 4 mounted on the ECC modules 5 have substantially the same memory density and a "by 8" memory architecture ("×8"). Thus, the memory chips 4 used by the memory modules 1 and the ECC modules 5 may be identical.

Memory modules of a memory module group are operated synchronously, i. e., each time data is read from a specific memory module, data is also read from the other memory module of the same memory module group. In this way, no resources of the ECC modules 5 are wasted.

Figure 3:
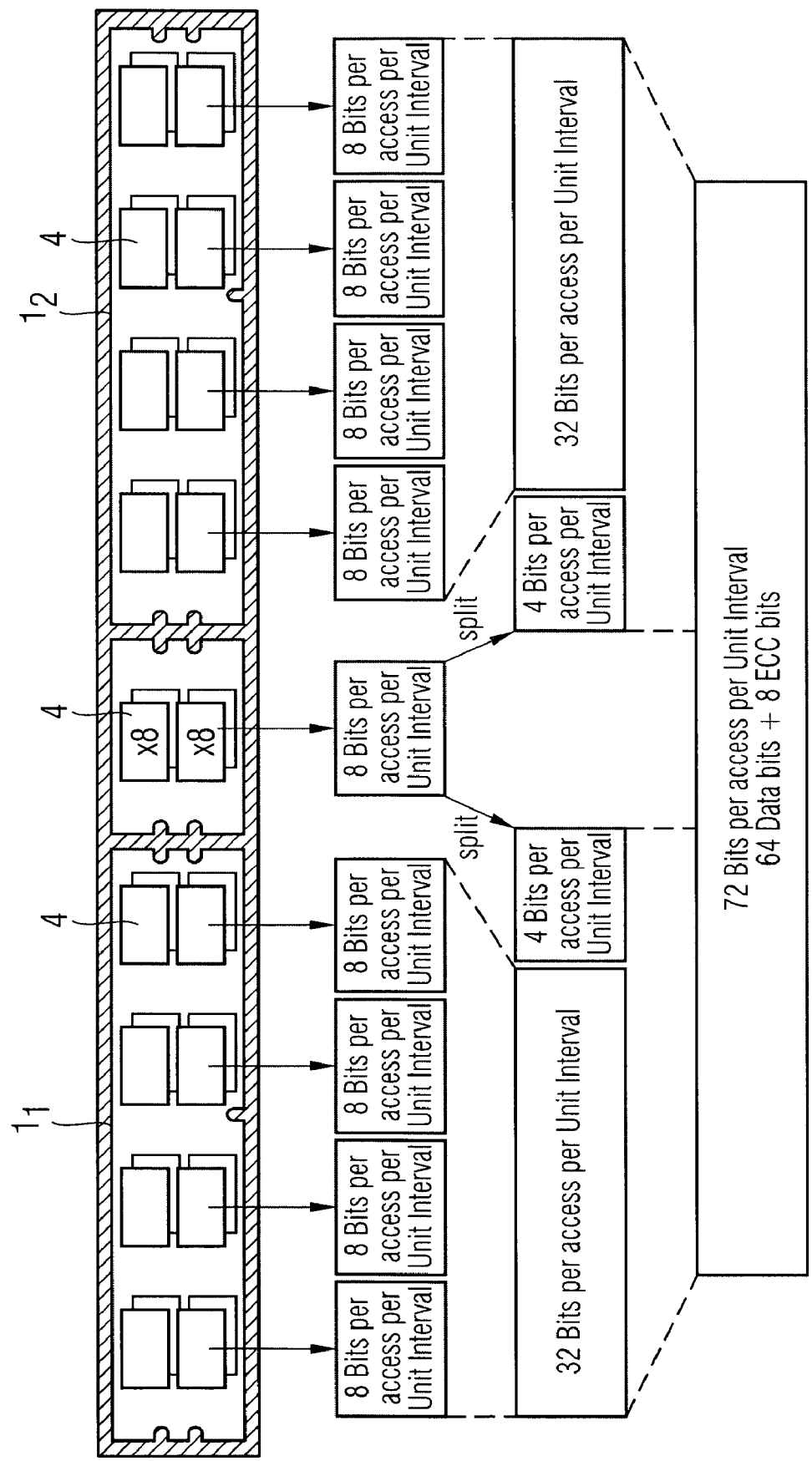
FIG. 3 shows a schematic drawing illustrating the data access scheme of the memory device shown in FIG. 2.

FIG. 3 shows how many bits are read from each memory module 1 or a memory module group A, B and the respective ECC module 5 during one memory access cycle. As can be derived from FIG. 3, 72 bits are read during one memory access interval (seventy-two bits from each memory module 1 and eight from the respective ECC module 5).

Figure 4:
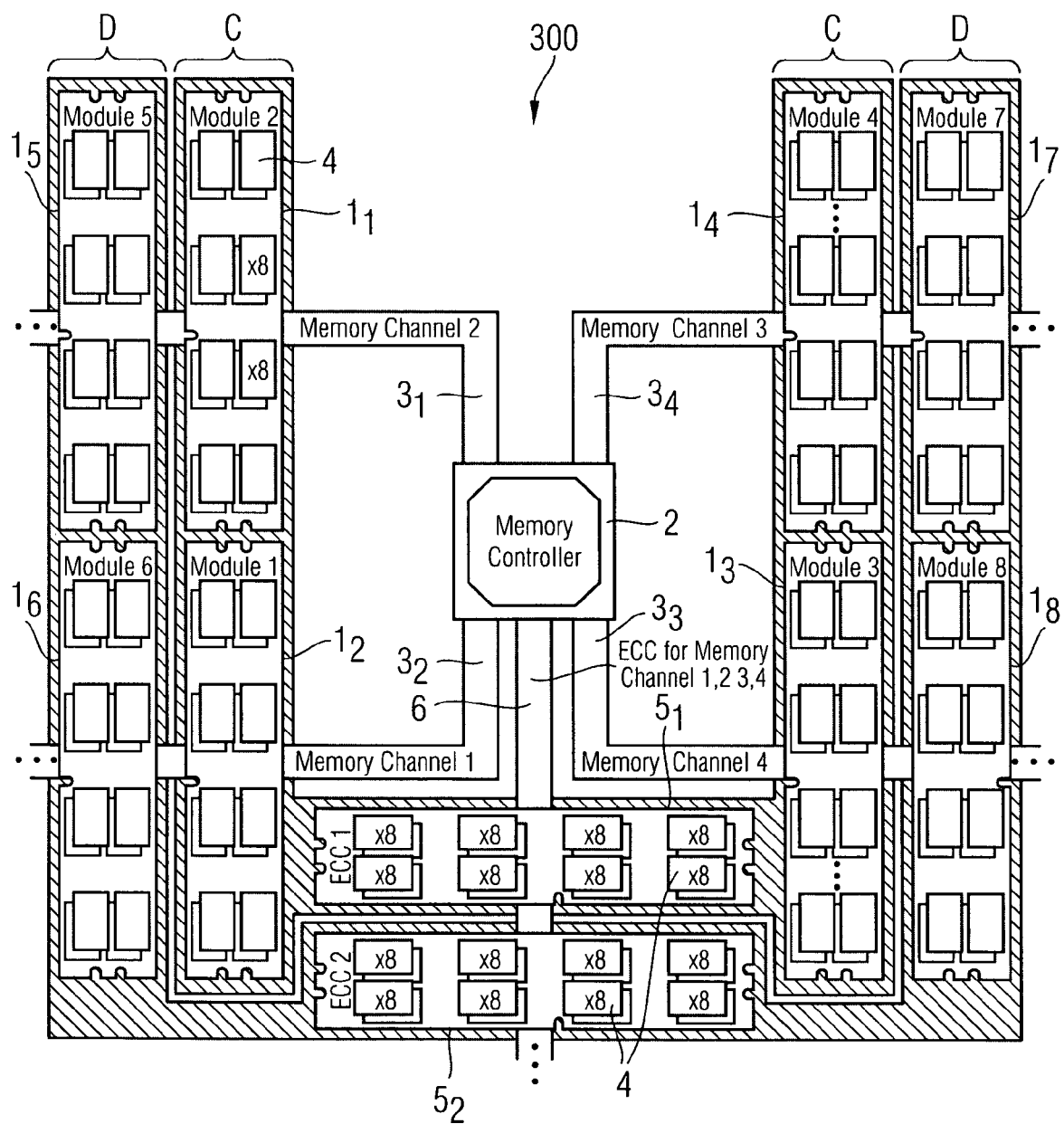
FIG. 4 shows a second embodiment of the memory device according to the present invention.

In FIG. 4, a second embodiment of the memory device according to the present invention is shown. In this embodiment, four memory channels 3 are used. The memory controller 2 is connected to at least four memory modules 1. Each memory module is connected to the memory controller 2 via a separate memory channel 3, i. e., by a point-to-point CA bus connection.

A memory module group C of this exemplary embodiment includes a first, a second, a third, and a fourth memory module $1_1$, $1_2$, $1_3$, $1_4$. The ECC module $5_1$ is assigned to the memory module group C. Further, a memory module group D includes a fifth, a sixth, a seventh, and an eighth memory module $1_5$, $1_6$, $1_7$, $1_8$ to which a second ECC module $5_2$ is assigned.

As shown in FIG. 4, further memory module groups (and further ECC modules corresponding thereto) may be added. Further memory module groups (and further ECC modules corresponding thereto) may also be added to the embodiment shown in FIG. 2.

Thus, the first memory module $1_1$, $1_5$ is connected to the memory controller 2 via a first memory channel $3_1$, the second memory module $1_2$, $1_6$ of each memory module group C, D is connected to the memory controller 2 via a second memory channel $3_2$, and so on.

The ECC modules 5 are substantially the same as the memory modules 1 in design of the plug contacts (which connect the modules to the memory channels 3) and memory chips 4. Alternatively, one rank of memory chips 4 of each ECC module 5 is left or half of the memory density as used in the memory modules 1 are used.

Figure 5:
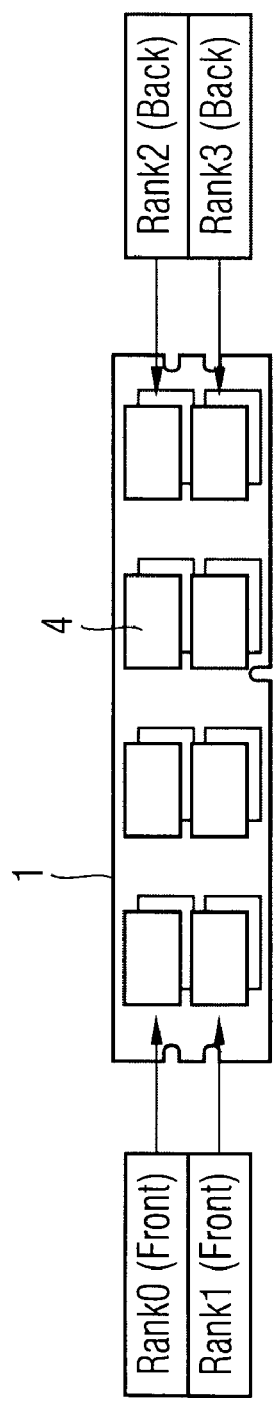
FIG. 5 shows a schematic drawing illustrating the architecture of the memory modules used in an embodiment of the memory device according to the present invention.
Figure 6:
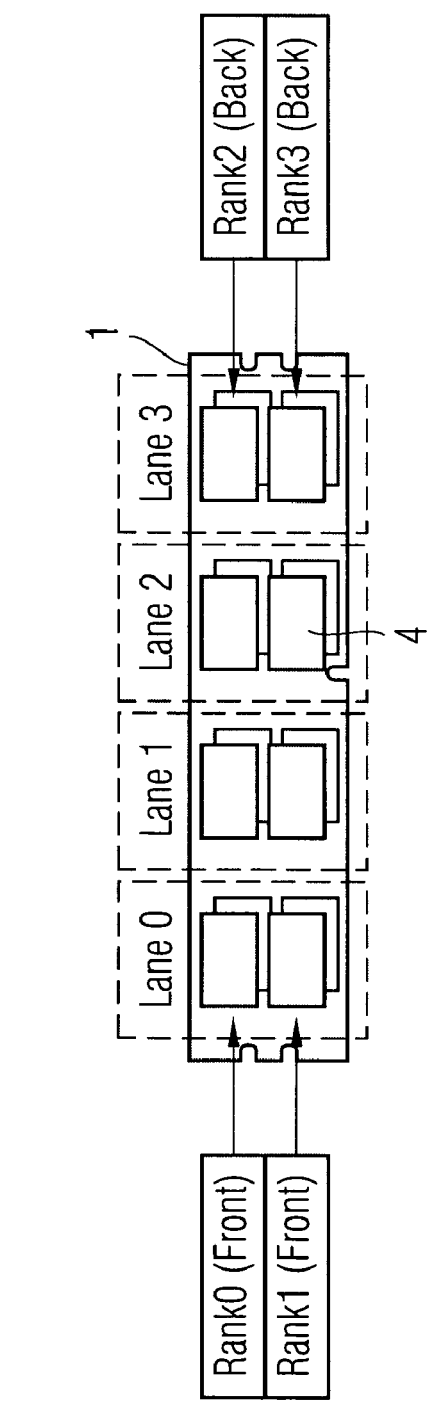
FIG. 6 shows a schematic drawing illustrating the architecture of the memory modules used in an embodiment of the memory device according to the present invention.
Figure 7:
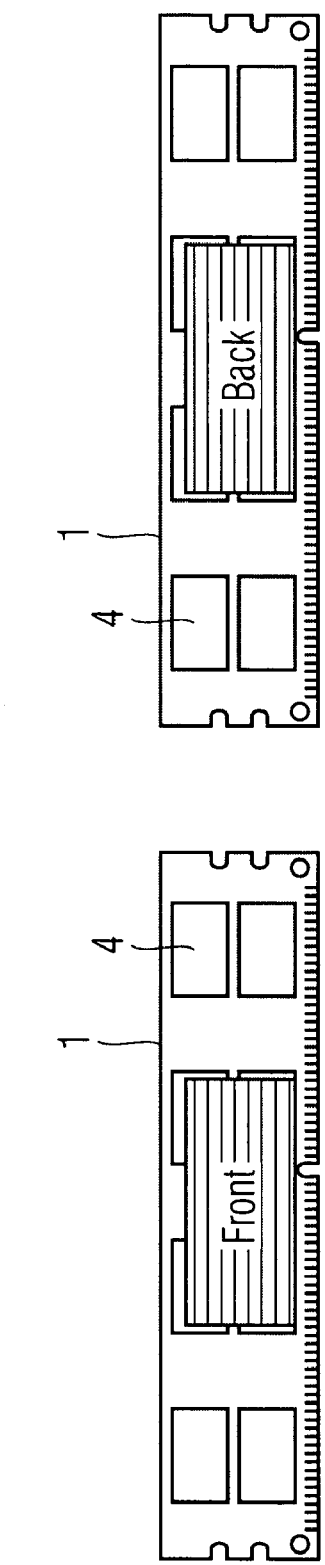
FIG. 7 shows a schematic drawing illustrating the architecture of the memory modules used in an embodiment of the memory device according to the present invention.

As indicated in FIGS. 5-7, each memory module 1 is provided with memory chips 4 (rank 0 and rank 1) at the front side. Alternatively, the backside of each memory module 1 is provided with two ranks of memory chips 4 (rank 2 and rank 3). This variation is possible for each exemplary embodiment of the present invention. In the same way, the backside of the ECC modules 5 has memory chips.

Figure 8:
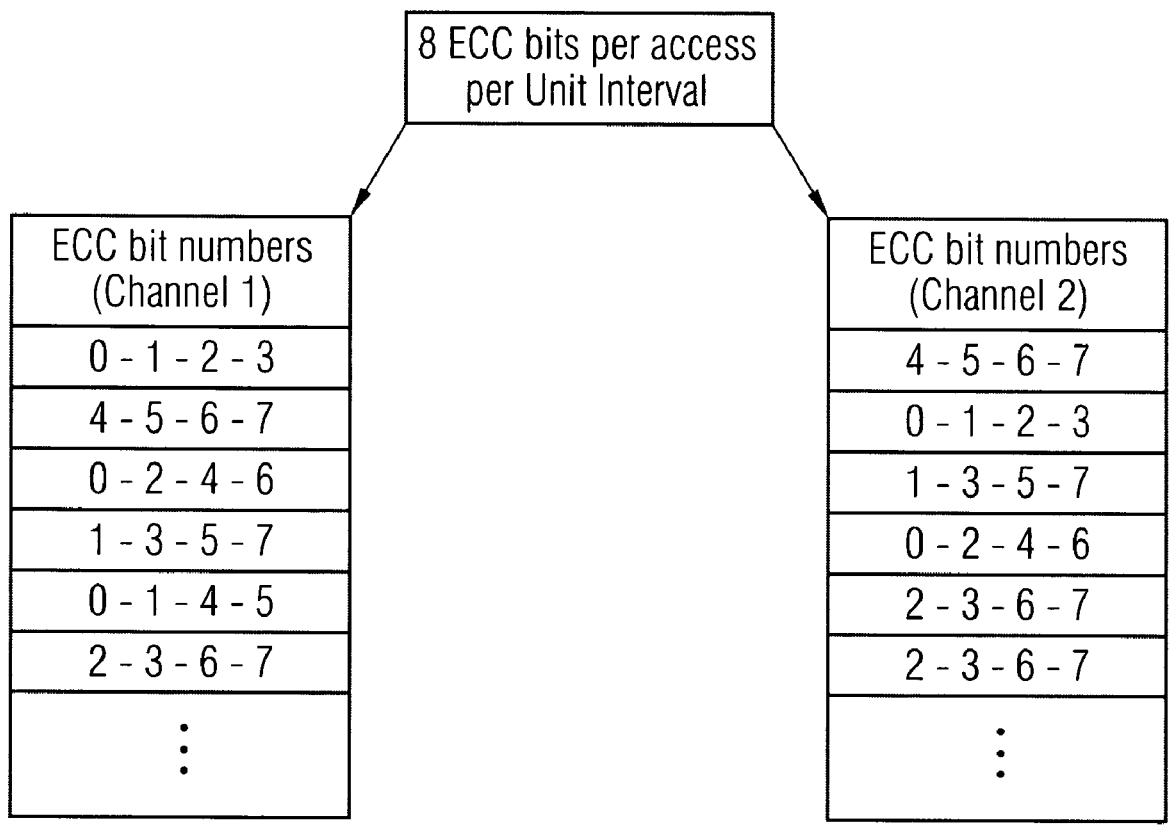
FIG. 8 shows possible access schemes for accessing the external ECC module of the memory device according to the present invention.

Referring to FIG. 8, the ECC modules 5 can be addressed in several ways.

According to a first aspect, the present invention relates to ECC support with a standard module with 4-chip-ranks in a "×8" configuration in multiple memory channel systems. Most of the current standard DRAM modules use eight DRAM chips that are configured in a by 8 (×8) configuration, i. e., 8 bits of data are delivered by each chip and a total of 64 data bits are delivered by a module per access and unit interval (data bit time). If ECC is required, typically a ninth DRAM chip using a "by 8" configuration is added to the module to provide the ECC functionality.

New memory technologies, such as NMT, use DRAM modules with four DRAM (data) chips per rank. Adding ECC to such a configuration would traditionally be done with an internal ECC solution. In a four chip per rank configuration, a fifth DRAM chip that uses a "×8" configuration is added, i.e., adding a fifth DRAM chip that uses a "×4" configuration, or by using four DRAM chips that use a "×9" configuration. These three ECC approaches have drawbacks. The first approach uses half of the fifth chip. The second and third approach require a separate chip design for the "×4" and "×9" configuration. Furthermore, internal ECC solutions require a higher pin count on the connector for ECC- compared to non-ECC-modules, i. e., a separate connector is required for ECC modules.

According to an embodiment of the present invention, no specialized connector is needed. Instead, an additional standard non-ECC DRAM DIMM with four chips per rank in a "×8" configuration to externally store the ECC data of four data DRAM modules is used. The solution requires that the system is equipped with a multiple of 4+1 modules. Further, 4+1 memory channels are required to achieve a similar latency and response behavior for the modules (4 data+1 ECC module). For each memory access (RD/WR etc.) the memory controller sends the access to the data module and at the same time to the ECC module. To be able to do this in parallel to the channels, each chip in the first rank has a point-to-point CA bus connection to the memory controller. This embodiment is in particular applicable to the server market. As already mentioned, in this embodiment a standard DIMM module is used to store the ECC information instead of a specialized ECC module. To do this, four (memory) channels are used together.

According to another embodiment of the present invention, the ECC solution is implemented for a system configuration with five memory channels. Four channels are used for the data and one additional channel is used for the ECC information. There is a point-to-point CA bus connection between each chip of rank 0 and the memory controller.

Referring to FIGS. 5 and 7, for simplicity, the two sides of the dual sided module are merged into a single view. Alternatively, for both sides, stacked chips, instead of two separated chips, as shown in the illustration, can be used.

According to a second aspect, the present invention relates to external ECC support for 4-chip-ranks in a "×8" configuration in dual memory channel systems. A "×4" DRAM chip design is not needed in a dual memory channel systems. Instead of using two external ECC modules for each DRAM data module pair, one ECC module that uses a "×8" configuration is used, thus, saving half the amount of ECC modules. The external ECC module has twice the density of the "×4" configuration ECC modules. The single "×8" ECC module is shared by the two DRAM data modules. To be able to do this both channels are operated in a synchronous mode, i.e., the modules within the two channels are usedsubstantially simultaneously and act like one module with a doubled bus width.

According to the second aspect of the present invention, a single external "×8" ECC module is used, instead of two external "×4" ECC modules in a synchronously operated dual channel system that uses four data DRAM chip per rank.

According to FIGS. 5-7, the memory modules is, for example, dual sided:

Front side: Two RANKS each with four chips in a "by 8" architecture.

Back side: Two RANKS each with four chips in a "by 8" architecture.

Thus, a total of four ranks is provided on the DRAM module. The phrase "by 8 configuration" means that the DRAM chip delivers 8 bits per chip per access per unit interval (data bit time).

The ECC solution, for example, is implemented for a dual memory channel system configuration. Such a configuration uses both modules for a memory access (Read or Write, etc.) at the same time. This means both modules are used substantially simultaneously and act like one module with a doubled bus width.

The data bits from every DRAM chip are, for example, collected, as shown in FIG. 3. The splitting of the 8 ECC bits is done depending on the ease of synchronization of the data bits with the ECC bits. A possible approach to spread the ECC bits to the two memory channels is illustrated in FIG. 8.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

REFERENCE LIST

100, 200, 300 memory device
1 memory module
2 memory controller
3 memory channel
4 memory chip
5 ECC module
6 ECC channel
A, B, C, D memory module groups

What is claimed is:

1. A memory device, comprising:
a group of memory modules, each of the memory modules comprising a plurality of memory chips;
an external error correction code (ECC) module comprising at least one memory chip, wherein the external ECC module is configured to provide ECC functionality that is shared by the memory modules of the group; and
a memory controller configured to synchronously access the at least one memory chip of the external ECC module and memory chips of the memory modules of the group during a memory access cycle.

2. The memory device according to claim 1, wherein the memory chips of the memory modules have substantially the same memory density as the at least one memory chip of the external ECC module.

3. The memory device according to claim 1, wherein properties of the memory chips of the memory modules are substantially the same as properties of the at least one memory chip of the external ECC module.

4. The memory device according to claim 1, wherein the memory chips of the memory modules and the at least one memory chip of the external ECC module have a "by eight" organization.

5. The memory device according to claim 1, wherein each of the memory modules includes four ranks of memory chips.

6. The memory device according to claim 5, wherein a first memory rank of each of the memory modules is connected to the memory controller by a point-to-point command/address (CA) bus connection.

7. The memory device according to claim 1, wherein the group of memory modules includes two memory modules.

8. The memory device according to claim 1, wherein the group of memory modules includes four memory modules.

9. The memory device according to claim 8, wherein the memory modules have an electrical connector arrangement that is substantially the same as an electrical connector arrangement of the external ECC module.

10. The memory device according to claim 1, wherein properties of the memory modules are substantially the same as properties of the external ECC module.

11. The memory device of claim 1, wherein the group of memory modules comprises a first group of memory modules and the external ECC module comprises a first external ECC module, the memory device further comprising:
a second group of memory modules each comprising a plurality of memory chips; and
a second external ECC module comprising at least one memory chip, wherein the second external ECC module is configured to provide ECC functionality that is shared by the memory modules of the second group;
wherein the memory controller is coupled to the first and second external ECC modules via a common ECC channel, and the memory controller is configured to synchronously access the at least one memory chip of the second external ECC module and memory chips of the memory modules of the second group during a memory access cycle.

12. The memory device of claim 1, wherein the memory chips of the memory modules are identical to the at least one memory chip of the external ECC module.

13. The memory device of claim 1, wherein a relation of a memory density of the at least one memory chip of the external ECC module to a memory density of the memory chips of the memory modules depends on the number of memory modules to which the external ECC module is assigned to provide ECC functionality.

14. The memory device of claim 1, wherein the memory controller simultaneously accesses the memory chips of the external ECC module and the memory modules in parallel.

15. The memory device of claim 1, wherein the memory controller is connected to the ECC module via an ECC channel.

16. A memory device, comprising:

first and second groups of memory modules, each of the memory modules comprising a plurality of memory chips;

first and second external error correction code (ECC) modules respectively assigned to the first and second groups of memory modules, each of the external ECC modules comprising at least one memory chip that is substantially the same as the memory chips of the memory modules of the first and second groups, wherein the first external ECC module is configured to provide ECC functionality that is shared by the memory modules of the first group and the second external ECC module is configured to provide ECC functionality that is shared by the memory modules of the second group; and a memory controller coupled to the memory modules of the first and second group via memory channels and coupled to the first and second external ECC modules via a common ECC channel, wherein the memory controller is configured to synchronously access the at least one memory chip of the first external ECC module and memory chips of the memory modules of the first group during a memory access cycle, and wherein the memory controller is configured to synchronously access the at least one memory chip of the second external ECC module and memory chips of the memory modules of the second group during a memory access cycle.

17. A method of operating a memory device, comprising:

assigning an external error correction code (ECC) module of the memory device to at least first and second memory modules of the memory device such that the external ECC module provides ECC functionality that is shared by the first and second memory modules, wherein the first and second memory modules and the external ECC module comprise memory chips;

synchronously performing a memory access to store bits in or retrieve bits from at least one memory chip of the external ECC module and memory chips of the first and second memory modules during a memory access cycle, wherein some of the bits accessed in the external ECC module are associated with bits accessed in the first memory module and others of the bits accessed in external ECC module are associated with bits accessed in the second memory module.

18. The method of claim 17, wherein the memory chips of the external ECC module and the first and second memory modules are substantially identical, and a same number of bits are accessed in the at least one memory chip of the external ECC module as in individual memory chips of the first and second memory modules during the memory access cycle.

19. The method of claim 17, wherein the memory chips of the external ECC module and the first and second memory modules are accessed simultaneously in parallel.

20. The method of claim 17, wherein the memory access is a read operation.

21. The method of claim 17, wherein the memory access is a write operation.

22. The method of claim 17, further comprising:

accessing the at least one memory chip of the external ECC module through an ECC channel between the ECC module and a memory controller.

* * * * *